US008941185B2

(12) United States Patent
Asai et al.

(10) Patent No.: US 8,941,185 B2
(45) Date of Patent: Jan. 27, 2015

(54) ACTIVE MATRIX SUBSTRATE, X-RAY SENSOR DEVICE, DISPLAY DEVICE

(75) Inventors: Yoshihiro Asai, Osaka (JP); Satoshi Horiuchi, Osaka (JP); Kazuyori Mitsumoto, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 13/982,569

(22) PCT Filed: Feb. 2, 2012

(86) PCT No.: PCT/JP2012/052419
§ 371 (c)(1),
(2), (4) Date: Jul. 30, 2013

(87) PCT Pub. No.: WO2012/108334
PCT Pub. Date: Aug. 16, 2012

(65) Prior Publication Data
US 2013/0307085 A1 Nov. 21, 2013

(30) Foreign Application Priority Data
Feb. 9, 2011 (JP) ................................. 2011-026403

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 27/088* (2006.01)
*H01L 27/146* (2006.01)

(52) U.S. Cl.
CPC ........ *H01L 27/088* (2013.01); *H01L 27/14658* (2013.01); *H01L 27/14605* (2013.01)
USPC ........................ 257/390; 257/59; 257/E27.11

(58) Field of Classification Search
USPC ..................................... 257/59, 390, E27.113
See application file for complete search history.

(56) References Cited

U.S. PATENT DOCUMENTS

| 7,759,801 | B1* | 7/2010 | Lesea et al. | 257/775 |
| 2002/0084965 | A1 | 7/2002 | Park | |
| 2003/0169146 | A1* | 9/2003 | Kawai et al. | 337/333 |
| 2009/0230396 | A1* | 9/2009 | Na et al. | 257/59 |
| 2011/0025635 | A1* | 2/2011 | Lee | 345/173 |
| 2011/0169018 | A1* | 7/2011 | Hsiao et al. | 257/88 |

FOREIGN PATENT DOCUMENTS

JP 2002-287721 A 10/2002

OTHER PUBLICATIONS

Official Communication issued in International Patent Application No. PCT/JP2012/052419, mailed on Feb. 28, 2012.

* cited by examiner

*Primary Examiner* — Phuc Dang
(74) *Attorney, Agent, or Firm* — Keating & Bennett, LLP

(57) ABSTRACT

An active matrix substrate of the present invention includes: a first signal line and a second signal line which are aligned in a column direction in which the first signal line and the second signal line extend; a first transistor and a second transistor; and a first electrode and a second electrode, the first signal line being connected via the first transistor to the first electrode, and the second signal line being connected via the second transistor to the second electrode, and the first signal line having a first end which is one of both ends of the first signal line and faces the second signal line, the first end including a tapered part which is tapered toward the second signal line. This makes it possible to prevent a leakage defect from occurring between two signal lines which are aligned in a direction in which the two signal lines extend.

19 Claims, 18 Drawing Sheets

ACTIVE MATRIX SUBSTRATE, X-RAY SENSOR DEVICE, DISPLAY DEVICE

TECHNICAL FIELD

The present invention relates to an active matrix substrate including two signal lines which are aligned in an identical direction in which the two signal lines extend.

BACKGROUND ART

According to an active matrix substrate which is used for an x-ray sensor device or a display device, in order to achieve high-speed driving and a reduction in load, a signal line (reading line or data line) which corresponds to an identical pixel column may be divided into two separate signal lines (see Patent Literature 1).

CITATION LIST

Patent Literature

Patent Literature 1
Japanese Patent Application Publication, Tokukai, No. 2002-287721

SUMMARY OF INVENTION

Technical Problem

In this case, in order to prevent unsatisfactory sensing or display in a vicinity of a gap between the two separate signal lines (signal lines which are aligned in an identical direction in which the signal lines extend), the gap is desired to be smaller. However, the gap which is made smaller causes a problem such that the two separate signal lines are easily short-circuited in a production process.

An object of the present invention is to provide an active matrix substrate in which a short circuit is prevented from occurring between signal lines which are aligned in an identical direction in which the signal lines extend.

Solution to Problem

An active matrix substrate of the present invention includes: a first signal line and a second signal line which are aligned in a column direction in which the first signal line and the second signal line extend; a first transistor and a second transistor; and a first electrode and a second electrode, the first signal line being connected via the first transistor to the first electrode, and the second signal line being connected via the second transistor to the second electrode, and the first signal line having a first end which is one of both ends of the first signal line and faces the second signal line, the first end including a tapered part which is tapered toward the second signal line. The configuration makes it possible to prevent an occurrence of a short circuit between the first signal line and the second signal line.

Advantageous Effects of Invention

According to the present invention, it is possible to provide an active matrix substrate in which a short circuit is prevented from occurring between signal lines which are aligned in an identical direction in which the signal lines extend.

DESCRIPTION OF EMBODIMENTS

Embodiments of the present invention are described below with reference to FIG. 1 through FIG. 20. Note that for convenience, a wording of 'a column direction (a direction perpendicular to the column direction is a row direction)' is used to explain an active matrix substrate. However, the 'column direction' may be either a longitudinal direction or a transverse direction in a state in which an x-ray sensor device or a liquid crystal display device is used.

Figure 1:
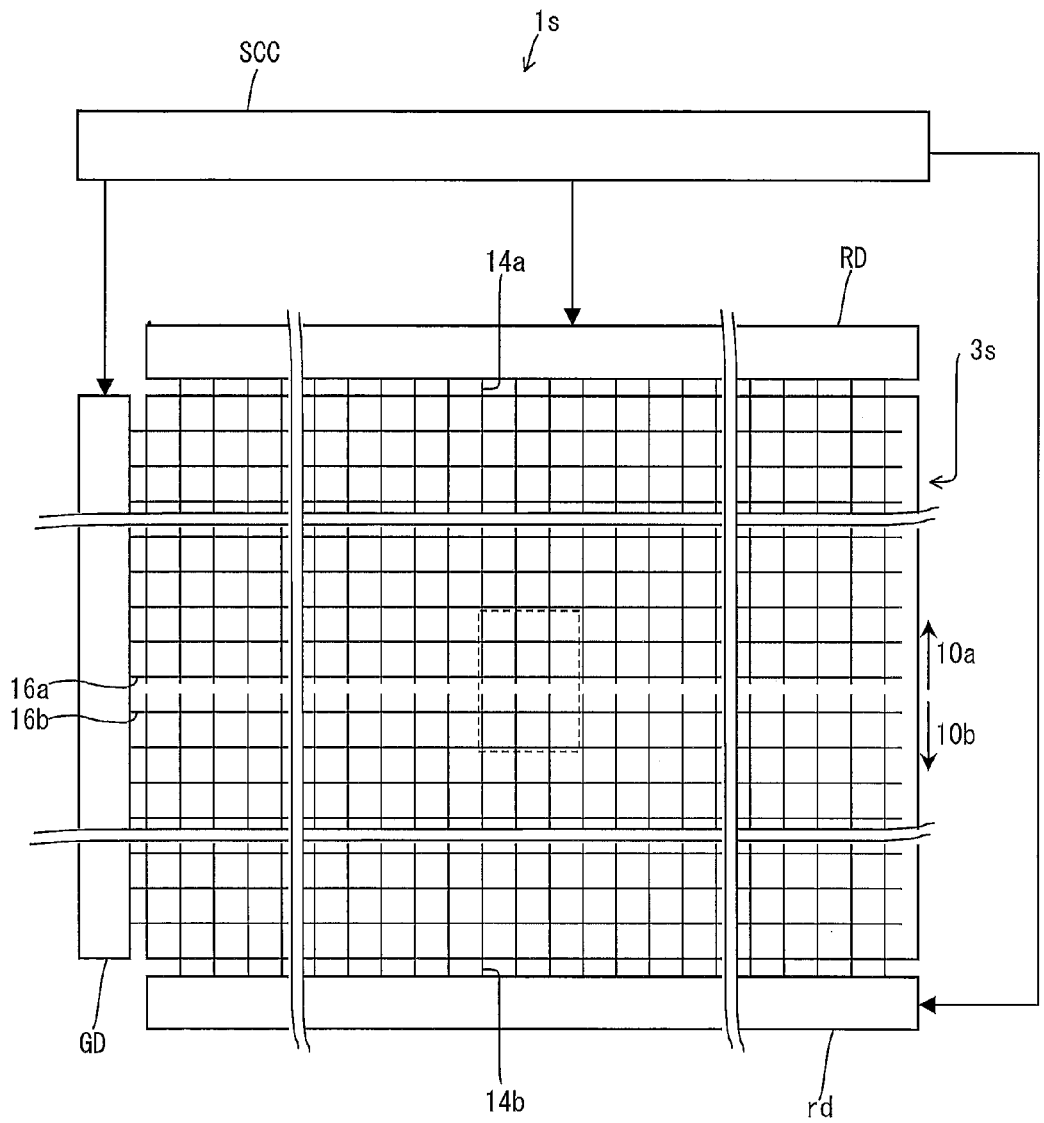
FIG. 1 is a schematic view which shows a configuration of an x-ray sensor device in accordance with the present invention.
Figure 2:
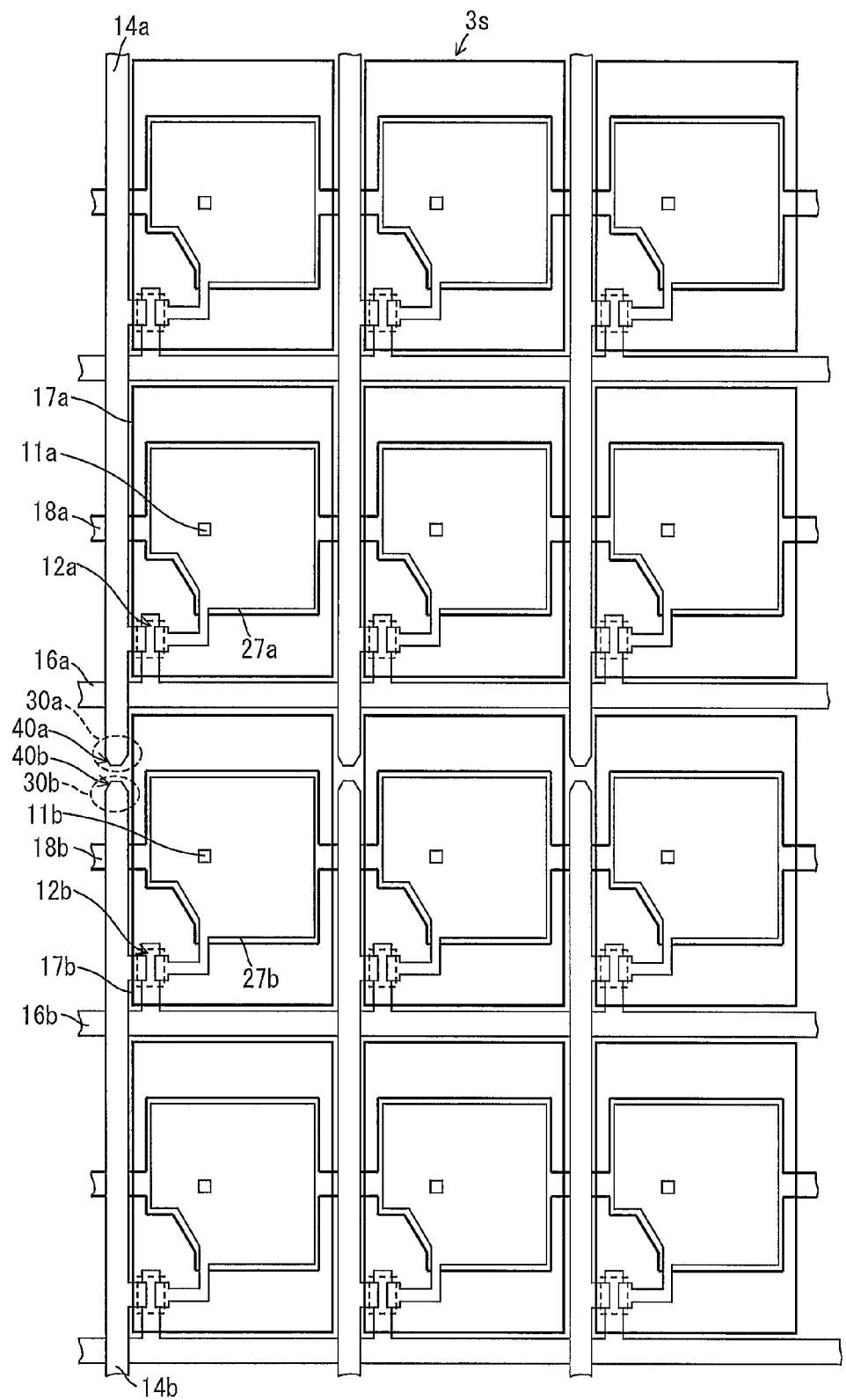
FIG. 2 is a plan view which shows a configuration of a part enclosed by a broken line in FIG. 1 (a part of an active matrix substrate).
Figure 3:
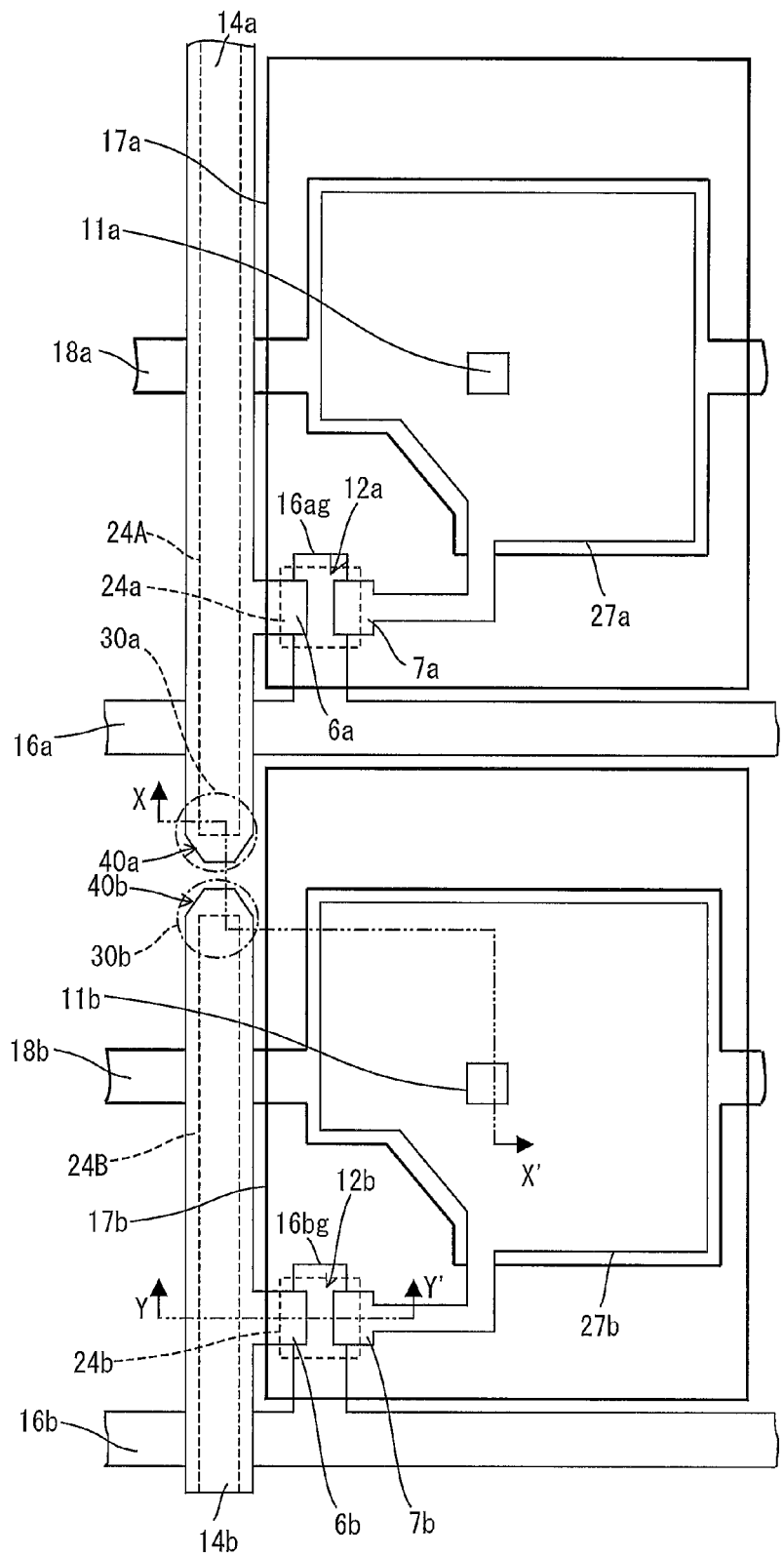
FIG. 3 is an enlarged view of a part of FIG. 2.
Figure 4:
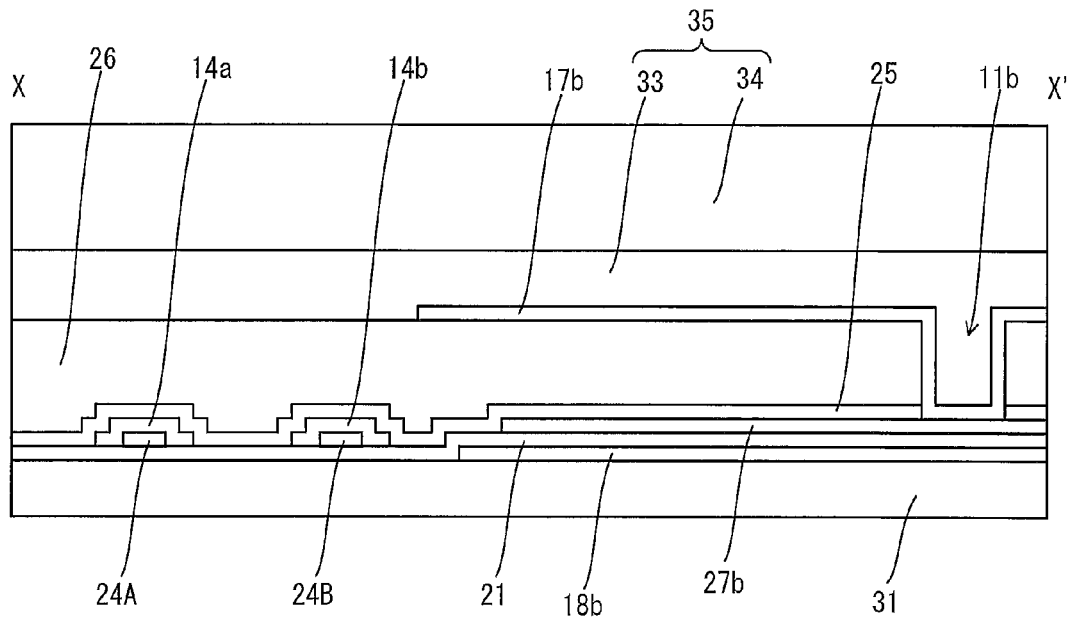
FIG. 4 is a cross-sectional view taken from the line X-X' of FIG. 3.
Figure 5:
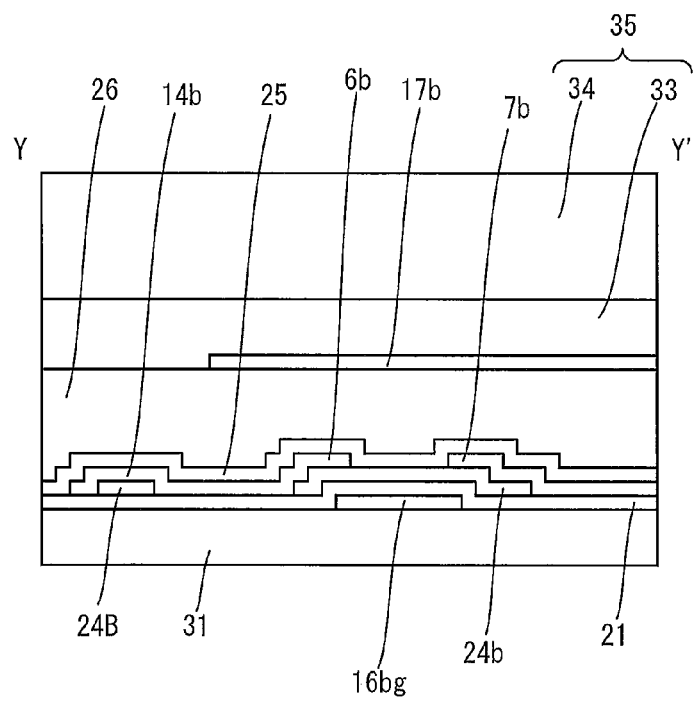
FIG. 5 is a cross-sectional view taken from the line Y-Y' of FIG. 3.

[First Embodiment]
FIG. 1 is a schematic view which shows a configuration of an x-ray sensor device of a first embodiment. FIG. 2 is a plan view which shows a configuration of a part enclosed by a broken line in FIG. 1 (a part of an active matrix substrate). FIG. 3 is an enlarged view of a part of FIG. 2. FIG. 4 is a cross-sectional view taken from the line X-X' of FIG. 3. FIG. 5 is a cross-sectional view taken from the line Y-Y' of FIG. 3.

An x-ray sensor device 1s includes an active matrix substrate 3s, a gate driver GD, a first readout driver RD, a second readout driver rd, and a sensor control circuit SCC (see FIG. 1).

The active matrix substrate 3s has (i) a first region 10a located upstream of a scanning direction and (ii) a second region 10b located downstream of the scanning direction (see FIG. 1). In the first region 10a, a plurality of readout lines (including a readout line 14a) which extend in the column direction (scanning direction, longitudinal direction in FIG. 1) are aligned in the row direction (transverse direction in FIG. 1), and a plurality of scanning lines (including a scanning line 16a) which extend in the row direction are aligned in the column direction (longitudinal direction in FIG. 1). In the second region 10b, a plurality of readout lines (including a readout line 14b) which extend in the column direction (scanning direction, longitudinal direction in FIG. 1) are aligned in the row direction (transverse direction in FIG. 1), and a plurality of scanning lines (including a scanning line 16b) which extend in the row direction are aligned in the column direction (longitudinal direction in FIG. 1).

The readout line 14a and the readout line 14b which are provided so as to correspond to an identical pixel column are aligned in the column direction (vertically aligned in FIG. 2) (see FIG. 2). The readout line 14a is connected via a transistor 12a to a pixel electrode 17a (first electrode), which is a sensing pixel electrode. The readout line 14b is connected via a transistor 12b to a pixel electrode 17b (second electrode), which is a sensing pixel electrode.

More specifically, the transistor 12a has a gate electrode 16ag which is connected to the scanning line 16a (scanning line located at the bottom of the first region 10a), a source electrode 6a which is connected to the readout line 14a, and a drain electrode 7a which is connected to a drain drawing electrode 27a that overlaps a retention capacitor wire 18a and is connected via a contact hole 11a to the pixel electrode 17a (see FIG. 3). The transistor 12b has a gate electrode 16bg which is connected to the scanning line 16b (scanning line located at the top of the second region 10b), a source electrode 6b which is connected to the readout line 14b, and a drain electrode 7b which is connected to a drain drawing electrode 27b that overlaps a retention capacitor wire 18b and is connected via a contact hole 11b to the pixel electrode 17b.

The active matrix substrate 3s is configured as below (see FIG. 3 and FIG. 4). A gate metal which includes the retention capacitor wire 18b and the gate electrode 16bg of the transistor 12b is provided on a glass substrate 31. A gate insulating film 21 is provided so as to cover the gate metal. Semiconductor layers 24b, 24A, and 24B, and a source metal which includes the readout lines 14a and 14b, the drain drawing electrode 27b, and the source electrode and the drain electrode of the transistor 12b are stacked on the gate insulating film 21. An inorganic interlayer insulating film 25 and an organic interlayer insulating film 26 which is thicker than the inorganic interlayer insulating film 25 are stacked on the source metal. A pixel electrode layer which includes the pixel electrode 17b is provided on the organic interlayer insulating film 26. An electric charge conversion layer 35 (a structure in which an antimony trisulfide layer 33 and a selenium layer 34 are stacked) is provided on the pixel electrode layer. Note that the inorganic interlayer insulating film 25 and the organic interlayer insulating film 26 are removed in the contact hole 11b, so that the pixel electrode 17b and the drain drawing electrode 27b are in contact with each other. The electric charge conversion layer 35 supplies the pixel electrode 17b with electric charge in accordance with an amount of x-ray irradiation.

Refer to FIG. 1 again. The gate driver GD drives, in accordance with an instruction from the sensor control circuit SCC, the scanning lines (including the scanning line 16a) which are provided in the first region 10a and the scanning lines (including the scanning line 16b) which are provided in the second region 10b. The first readout driver RD drives, in accordance with the instruction from the sensor control circuit SCC, the readout lines (including the readout line 14a) which are provided in the first region 10a. The second readout driver rd drives, in accordance with the instruction from the sensor control circuit SCC, the readout lines (including the readout line 14b) which are provided in the second region 10b. More specifically, when the scanning line 16a is selected, electric charge accumulated in the pixel electrode 17a (electric charge in accordance with an amount of x-ray irradiation with respect to the pixel electrode 17a) is read out via the transistor 12a and the readout line 14a to the first readout driver RD. When the scanning line 16b is selected, electric charge accumulated in the pixel electrode 17b (electric charge in accordance with an amount of x-ray irradiation with respect to the pixel electrode 17b) is read out via the transistor 12b and the readout line 14b to the second readout driver rd.

According to the first embodiment, an end 30a which is one of both ends of the readout line 14a and faces the readout line 14b has a shape which is symmetrical about the row direction, and includes a tapered part 40a which is formed in a case where a polygonal line that is a part of a rim of the end 30a and protrudes toward the readout line 14b is made up of three sides other than a lower base of an isosceles trapezoid (a part which is tapered toward the readout line 14b). An end 30b which is one of both ends of the readout line 14b and faces the readout line 14a has a shape which is symmetrical about the row direction, and includes a tapered part 40b which is formed in a case where a polygonal line that is a part of a rim of the end 30b and protrudes toward the readout line 14a is made up of three sides other than a lower base of an isosceles trapezoid (a part which is tapered toward the readout line 14a). Namely, the end 30b and the end 30a are in line symmetry with respect to a line which extends through a center of a gap between the end 30a and the end 30b in the row direction.

According to the first embodiment, the end 30a of the readout line 14a is shaped to include the tapered part 40a and the end 30b of the readout line 14b is shaped to include the tapered part 40b. Therefore, during a photolithography process for forming the readout lines, light from an opening of a photomask is easily diffracted into a gap region between the readout line 14a and the readout line 14b, so that resist residue due to, for example, insufficient light exposure is less likely to occur in the gap region. This makes it possible to prevent an occurrence of a short circuit caused by a resist residue between the readout line 14a and the readout line 14b (If there is a resist residue, no metal in the gap region is removed, so that these readout lines are short-circuited). Such an advantage is clear in a case where a first part of an edge of the pixel electrode 17b extends along a gap between the readout line 14a and the readout line 14b and it is impossible to increase the gap (since the increase in gap causes the pixel electrode 17b and the other pixel electrodes to greatly differ in parasitic capacitance) (see FIG. 1 and FIG. 2).

Further, according to the first embodiment, since a rim of each of the tapered part 40a and the tapered part 40b is made up of three sides other than a lower base of an isosceles trapezoid, light is obliquely diffracted into the gap region between the readout line 14a and the readout line 14b from four directions. This effectively prevents an occurrence of resist residue.

In addition, according to the first embodiment, an influence of a parasitic capacitor defined between the pixel electrode 17b and the readout line 14a is reduced by causing a second part of the edge of the electrode 17b which second part extends along the readout line 14a to have a smaller length than a third part of the electrode 17b which third part extends along the readout line 14b.

Figure 6:
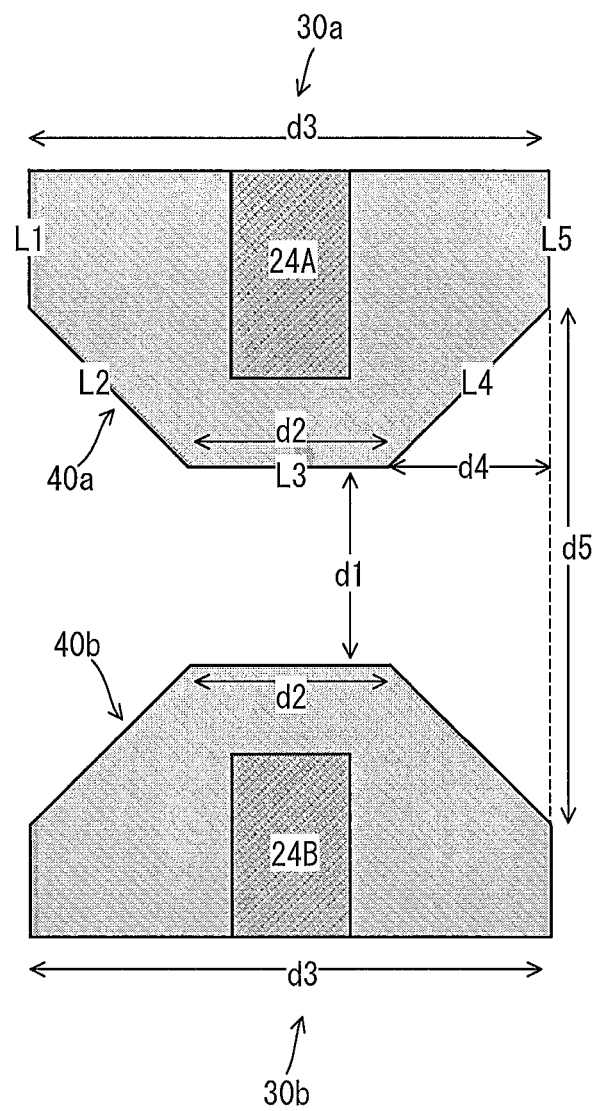
FIG. 6 is a plan view which shows respective specific shapes of a first end a second end.

FIG. 6 is a plan view which shows respective shapes of the end 30a and the end 30b. Note that the rim of the end 30a is made up of lines indicated by L1, L2, L3, L4, and L5. It is preferable that a distance (d1 in FIG. 6) (a minimum distance between the readout line 14a and the readout line 14b) between a tip of the tapered part 40a (a part of the rim of the tapered part 40a which part corresponds to an upper base of the isosceles trapezoid) and a tip of the tapered part 40b (a part of the rim of the tapered part 40b which part corresponds to an upper base of the isosceles trapezoid) be equal to or greater than a distance between the source electrode 6b and the drain electrode 7b of the transistor 12b. This is because during the photolithography process, the gap region between the readout line 14a and the readout line 14b is highly likely to be smaller in light exposure (further underexposed) than a gap region between the source electrode 6b and the drain electrode 7b which gap region is subjected to light reflected by the gate electrode 16bg.

In a case where a part other than the end of each of the readout line 14a and the readout line 14b has a width (d3 in FIG. 6) of 13 µm, a short circuit prevention effect can be obtained by causing the tip of each of the tapered part 40a and the tapered part 40b to have a width (d2 in FIG. 6) of 11 µm or less, i.e., by decreasing one side (d4 in FIG. 6) of the width d3 by 1 µm or more, and d2 is preferably less than half as small as d3 (if d3=13 µm, d2=5 µm, for example). Also, it is preferable that a distance (d5 in FIG. 6) between a root of the tapered part 40a and a root of the tapered part 40b be equal to or greater than the width (d3 in FIG. 6) of the part other than the end of each of the readout line 14a and the readout line 14b.

[Second Embodiment]

Figure 7:
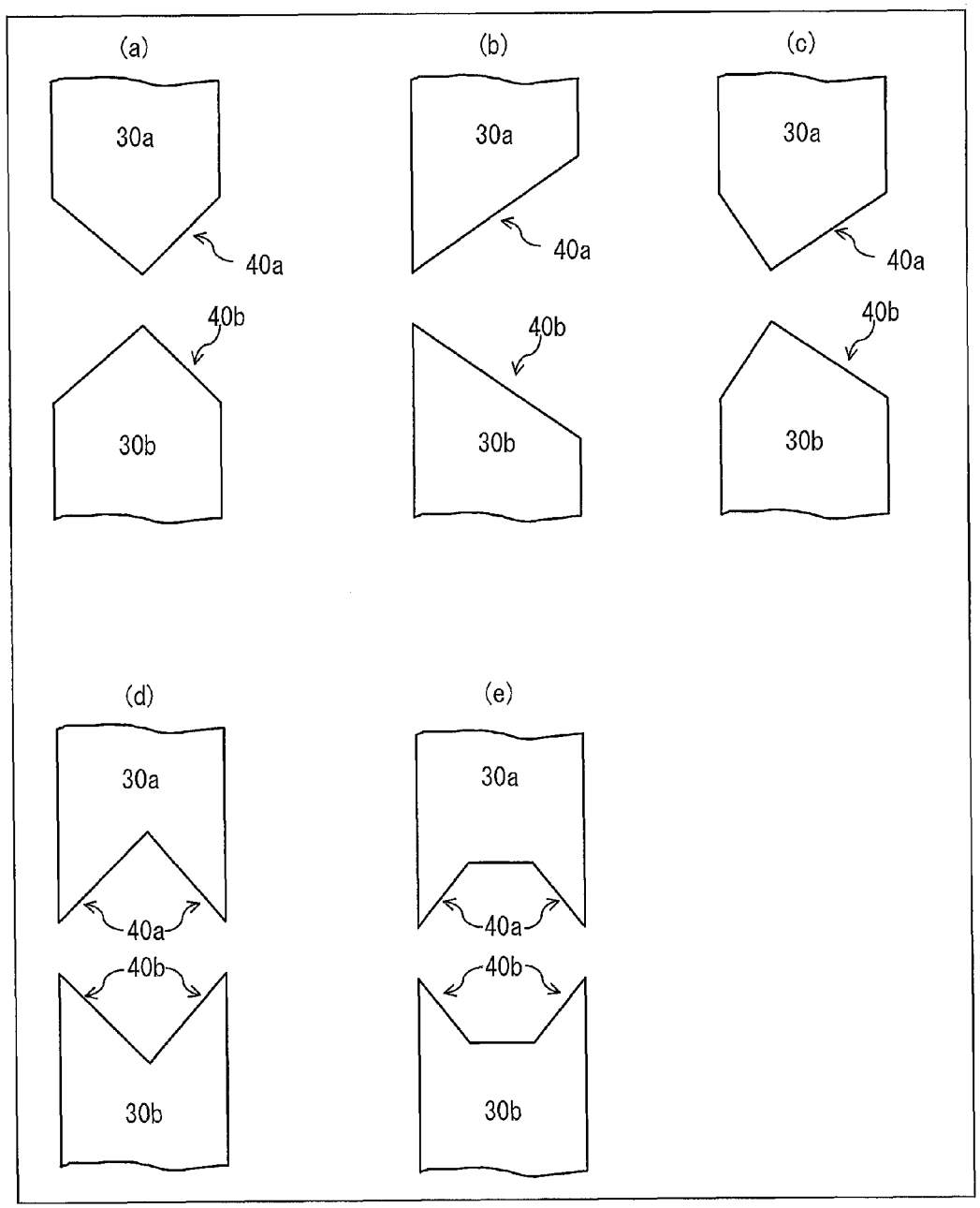
FIG. 7 is a plan view which shows an example of how the first end and the second end are configured (in which example respective rims of the first end and the second end are both polygonal lines).

An end 30a and an end 30b of FIG. 3 may have respective shapes shown in each of (a), (b), and (c) of FIG. 7. Namely, the end 30a includes a tapered part 40a which is formed in a case where a polygonal line that is a part of a rim of the end 30a and protrudes toward the readout line 14b is made up of two sides of a triangle. The end 30b includes a tapered part 40b which is formed in a case where a polygonal line that is a part of a rim of the end 30b and protrudes toward the readout line 14a is made up of two sides of a triangle. Such a configuration is suitable particularly in a case where the pixel electrodes are large in size (in a case where the pixel electrode 17b and the other pixel electrodes are less likely to differ in influence of a parasitic capacitor). As compared to the shapes shown in FIG. 6, the shapes shown in (a), (b), and (c) of FIG. 7 allow more light from an opening of a photomask to be obliquely diffracted into a gap between the end 30a and the end 30b from four directions, and are greater in short circuit prevention effect.

The end 30a and the end 30b may have respective shapes shown in (d) of FIG. 7. Namely, the end 30a includes the tapered part 40a which is formed in a case where a polygonal line that is a part of a rim of the end 30a and protrudes away from the readout line 14b is made up of two sides of a triangle. The end 30b includes the tapered part 40b which is formed in a case where a polygonal line that is a part of a rim of the end 30b and protrudes away from the readout line 14a is made up of two sides of a triangle.

The end 30a and the end 30b may have respective shapes shown in (e) of FIG. 7. Namely, the end 30a includes the tapered part 40a which is formed in a case where a polygonal line that is a part of a rim of the end 30a and protrudes away from the readout line 14b is made up of three sides other than a lower base of an isosceles trapezoid. The end 30b includes the tapered part 40b which is formed in a case where a polygonal line that is a part of a rim of the end 30b and protrudes away from the readout line 14a is made up of three sides other than a lower base of an isosceles trapezoid.

Figure 8:
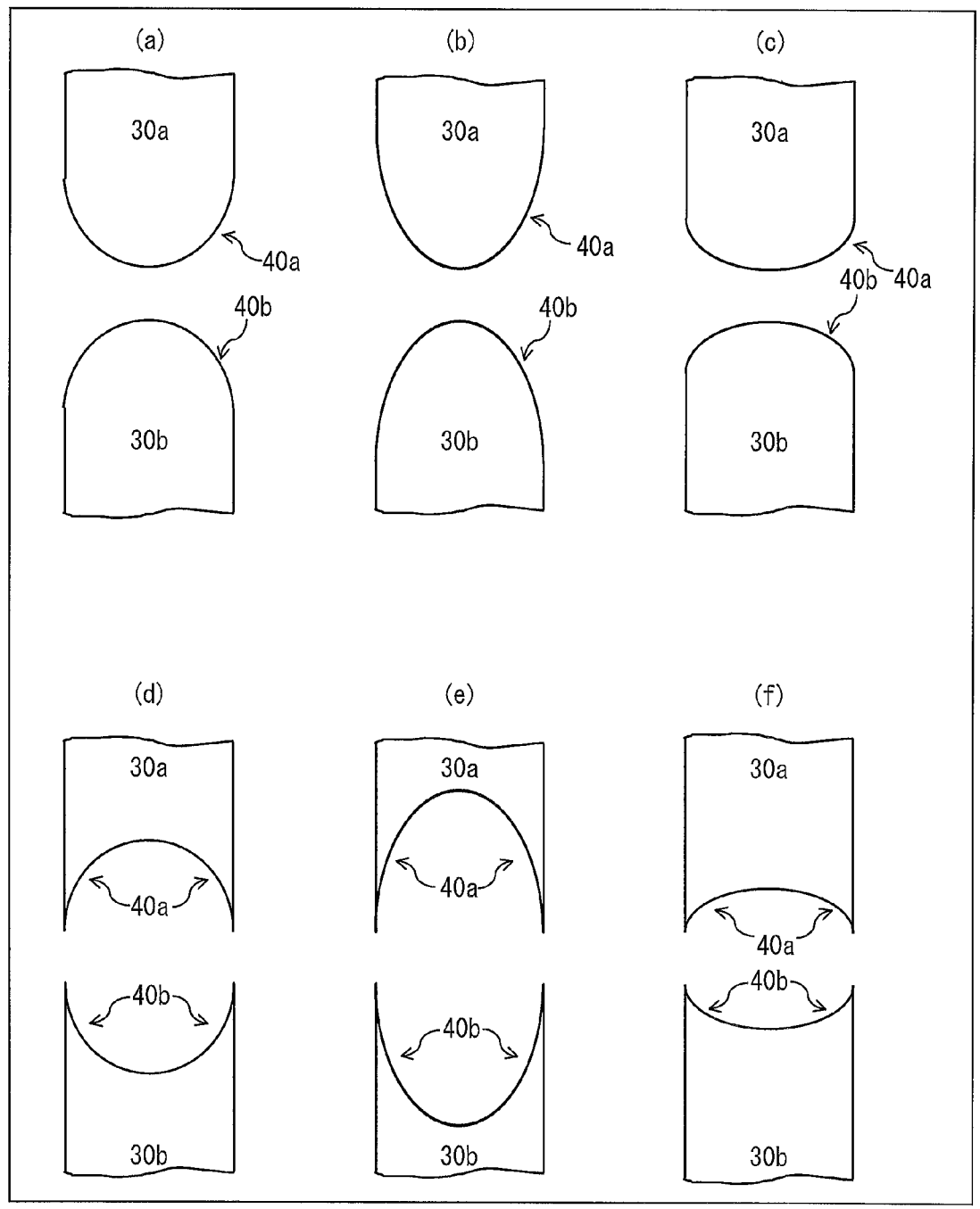
FIG. 8 is a plan view which shows an example of how the first end and the second end are configured (in which example the respective rims of the first end and the second end are both curved lines).
Figure 9:
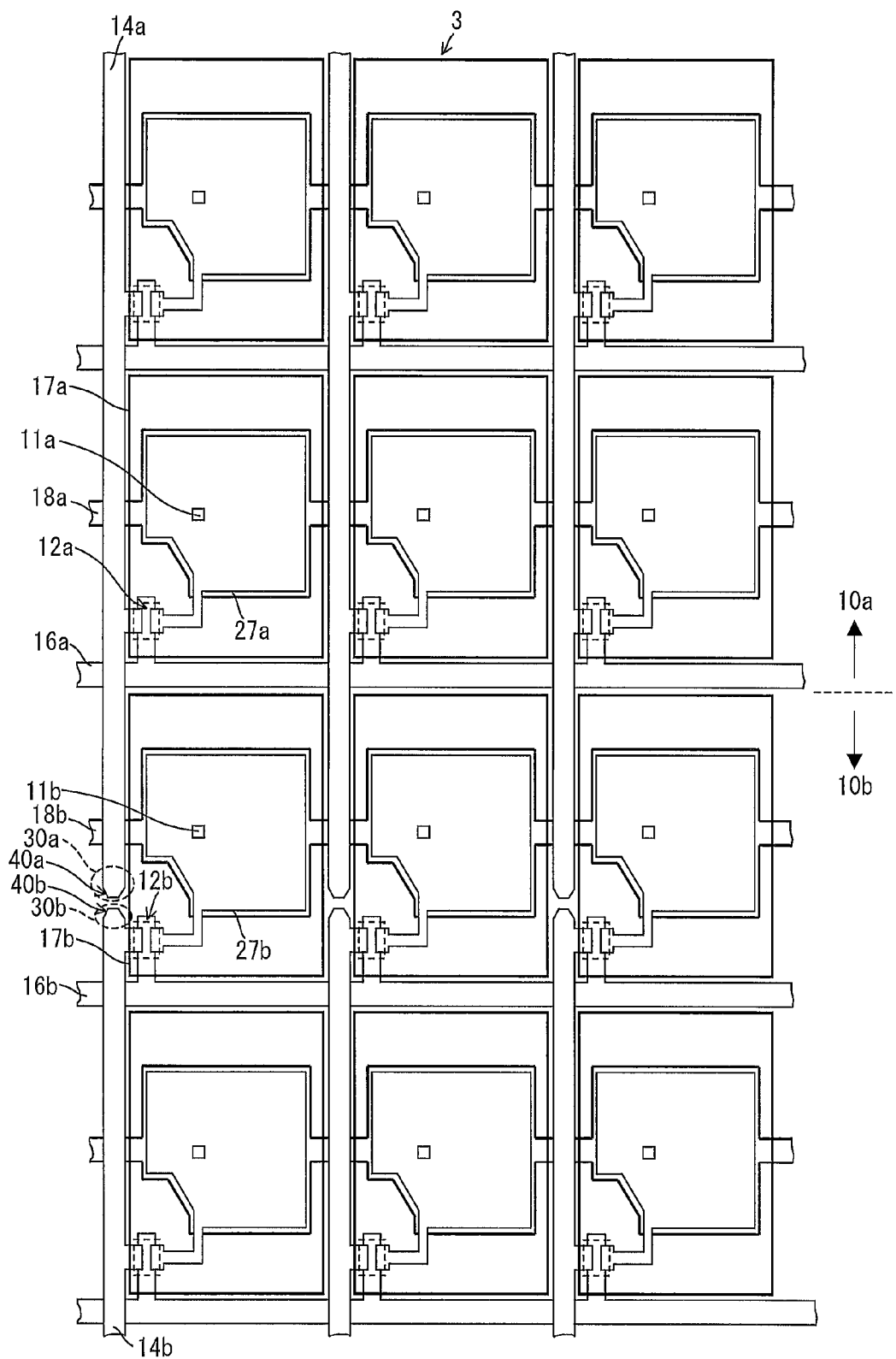
FIG. 9 is a plan view which shows a modified example of FIG. 2.
Figure 10:
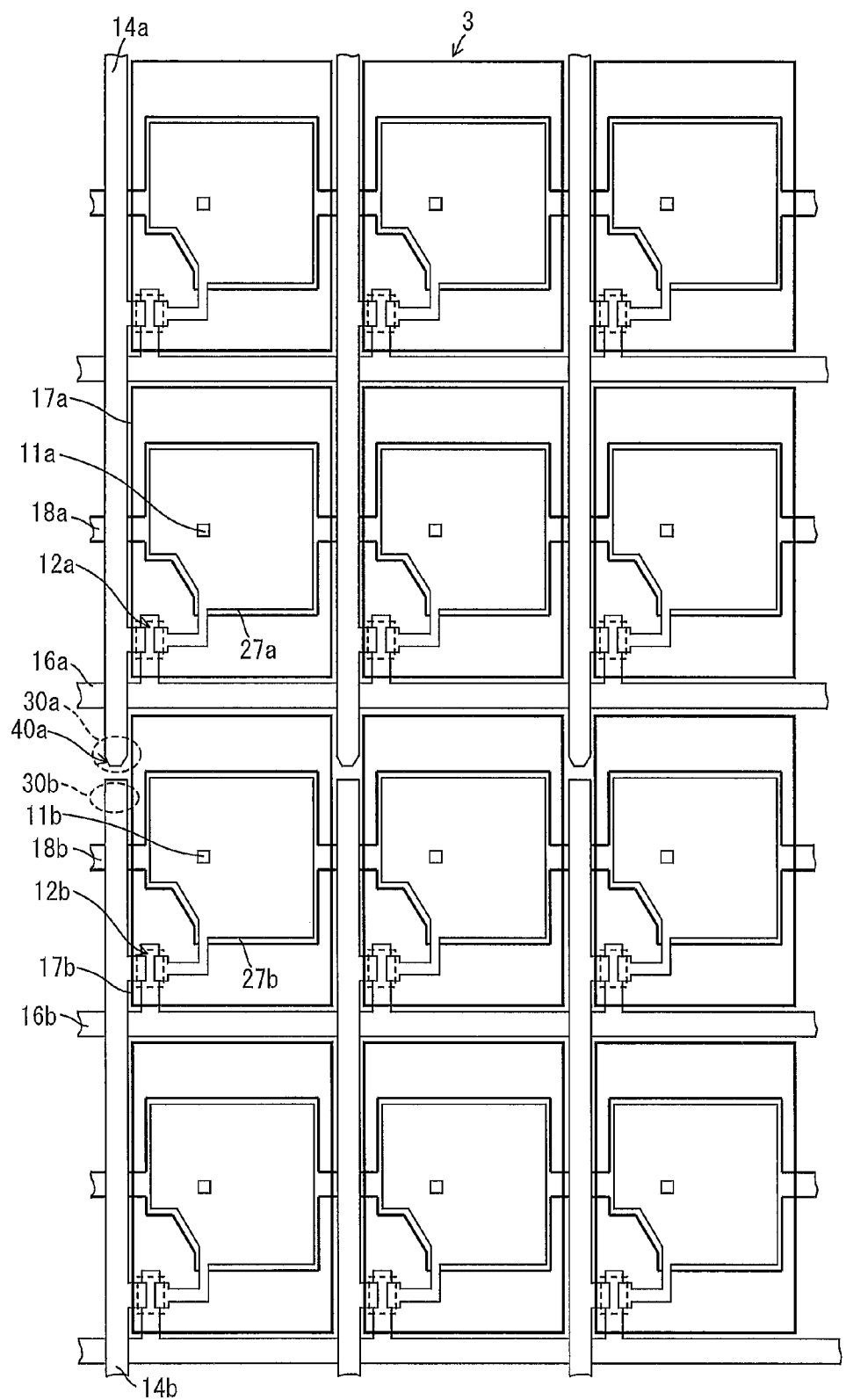
FIG. 10 is a plan view which shows another modified example of FIG. 2.

The end 30a and the end 30b may have respective shapes shown in (a) of FIG. 8. Namely, the end 30a includes the tapered part 40a which is formed in a case where a curved line that is a part of a rim of the end 30a and protrudes toward the readout line 14b is arc-shaped. The end 30b includes the tapered part 40b which is formed in a case where a curved line that is a part of a rim of the end 30b and protrudes toward the readout line 14a is arc-shaped.

The end 30a and the end 30b may have respective shapes shown in each of (b) and (c) of FIG. 8. Namely, the end 30a includes the tapered part 40a which is formed in a case where a curved line that is a part of a rim of the end 30a and protrudes toward the readout line 14b is quadratic-curve-shaped. The end 30b includes the tapered part 40b which is formed in a case where a curved line that is a part of a rim of the end 30b and protrudes toward the readout line 14a is quadratic-curve-shaped.

The end 30a and the end 30b may have respective shapes shown in (d) of FIG. 8. Namely, the end 30a includes the tapered part 40a which is formed in a case where a curved line that is a part of a rim of the end 30a and protrudes away from the readout line 14b is arc-shaped. The end 30b includes the tapered part 40b which is formed in a case where a curved line that is a part of a rim of the end 30b and protrudes away from the readout line 14a is arc-shaped.

The end 30a and the end 30b may have respective shapes shown in each of (e) and (f) of FIG. 8. Namely, the end 30a includes the tapered part 40a which is formed in a case where a curved line that is a part of a rim of the end 30a and protrudes away from the readout line 14b is quadratic-curve-shaped. The end 30b includes the tapered part 40b which is formed in a case where a curved line that is a part of a rim of the end 30b and protrudes away from the readout line 14a is quadratic-curve-shaped.

In FIG. 2, the gap between the readout line 14a and the readout line 14b is provided so as to be closer to the scanning line 16a. However, how to provide the gap is not limited to this. A gap between the readout line 14a and the readout line 14b can also be provided so as to be closer to the scanning line 16b (provided near a transistor 12b) (see FIG. 9).

Further, in FIG. 2, the end 30a and the end 30b include the respective tapered parts. However, how to configure the end 30a and the end 30b is not limited to this. Only the end 30a can include the tapered part 40a (a part which is tapered toward the readout line 14b) (see FIG. 10). Note that the tapered part 40a is formed in a case where a polygonal line that is a part of a rim of the end 30a and protrudes toward the readout line 14b is made up of three sides other than a lower base of an isosceles trapezoid. Such a configuration is suitable particularly in a case where the pixel electrodes are small in size (in a case where the pixel electrode 17b and the other pixel electrodes are highly likely to differ in influence of a parasitic capacitor). Similarly, the end 30a and the end 30b can be configured as shown in (a) through (e) of FIG. 11 by causing only the end 30a to include the tapered part 40a in (a) through (e) of FIG. 7. Further, the end 30a and the end 30b can also be configured as shown in (a) through (f) of FIG. 12 by causing only the end 30a to include the tapered part 40a in (a) through (f) of FIG. 8.

[Third Embodiment]

Figure 13:
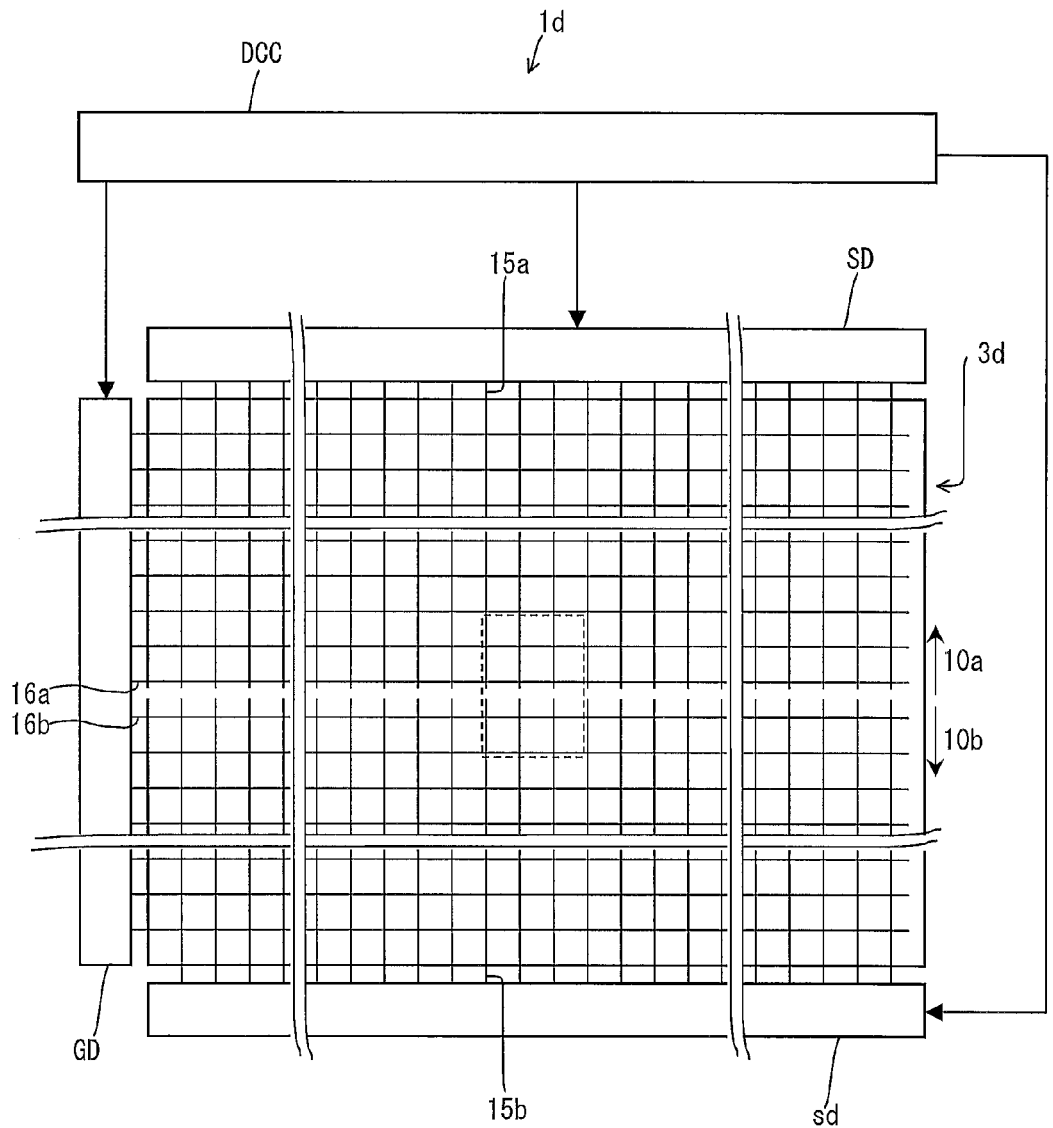
FIG. 13 is a schematic view which shows a configuration of a liquid crystal display device in accordance with the present invention.
Figure 14:
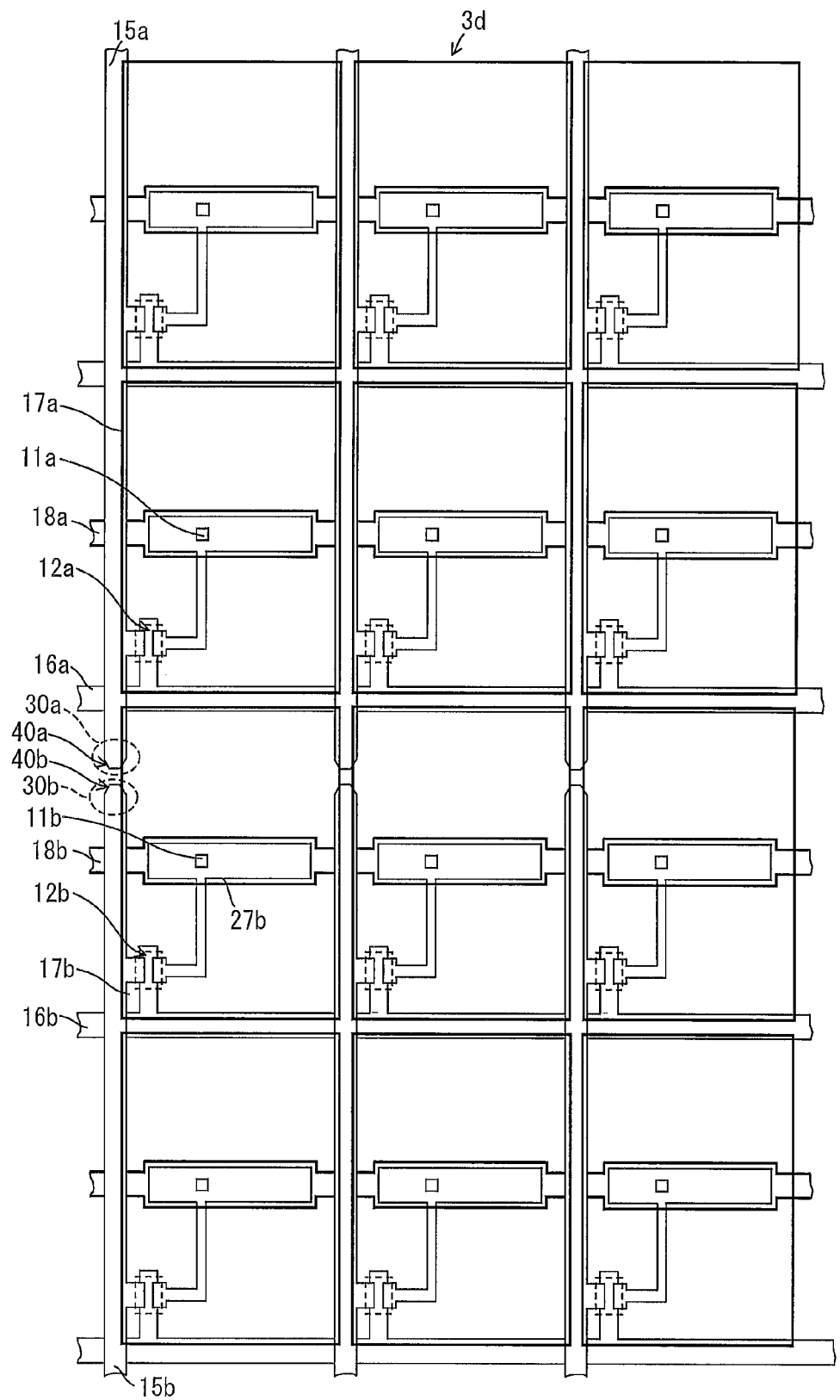
FIG. 14 is a plan view which shows a configuration of a part enclosed by a broken line in FIG. 13 (a part of an active matrix substrate).
Figure 15:
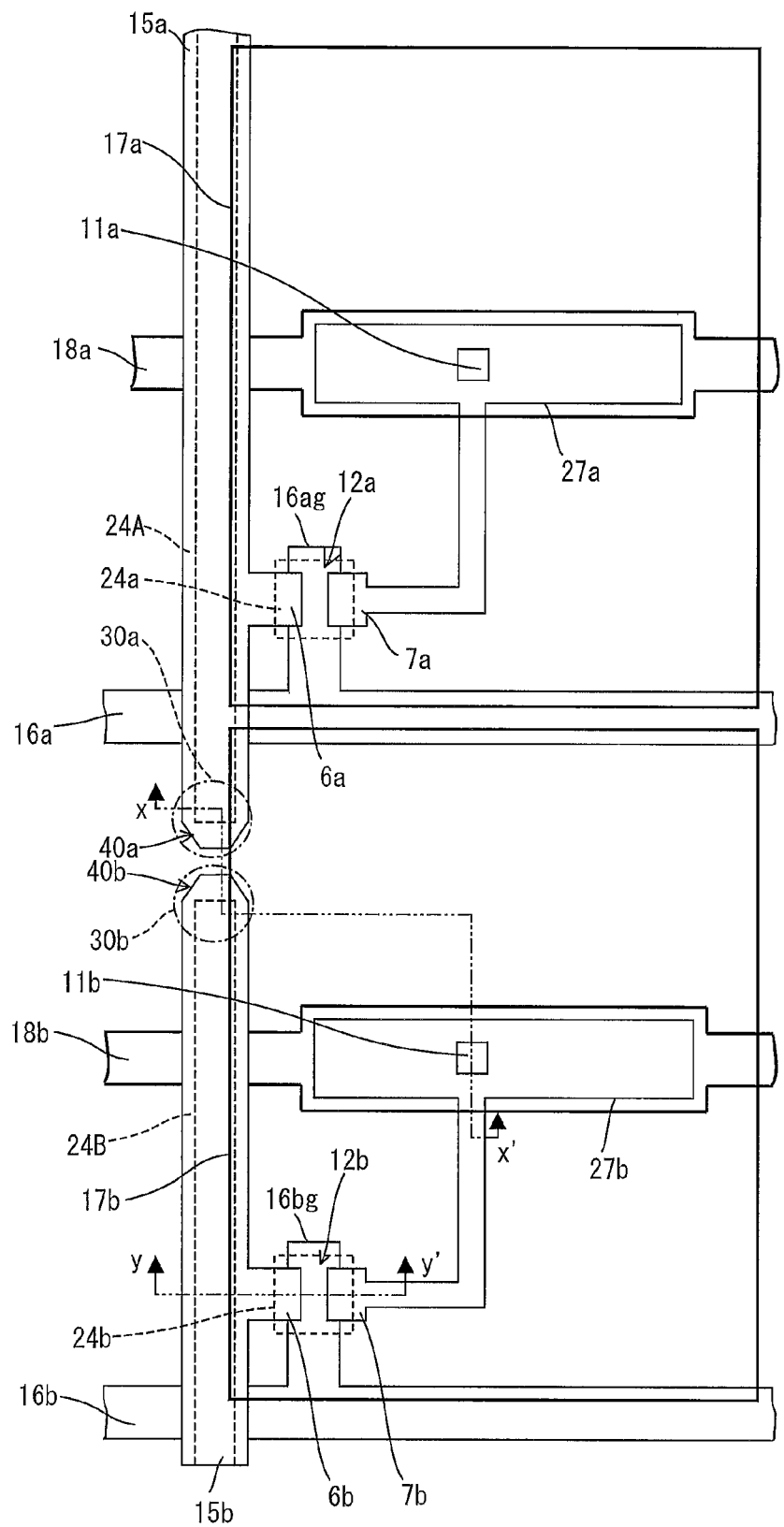
FIG. 15 is an enlarged view of a part of FIG. 14.
Figure 16:
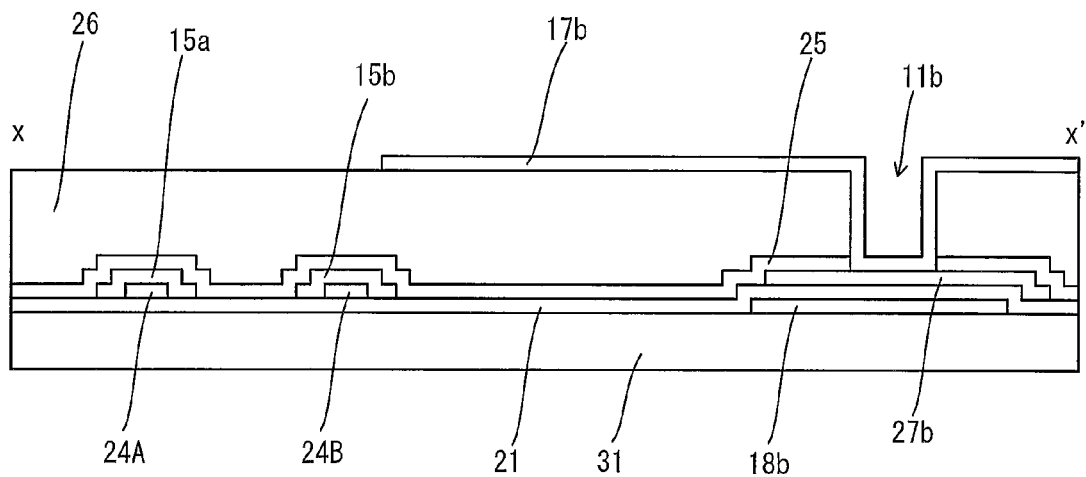
FIG. 16 is a cross-sectional view taken from the line x-x' of FIG. 15.
Figure 17:
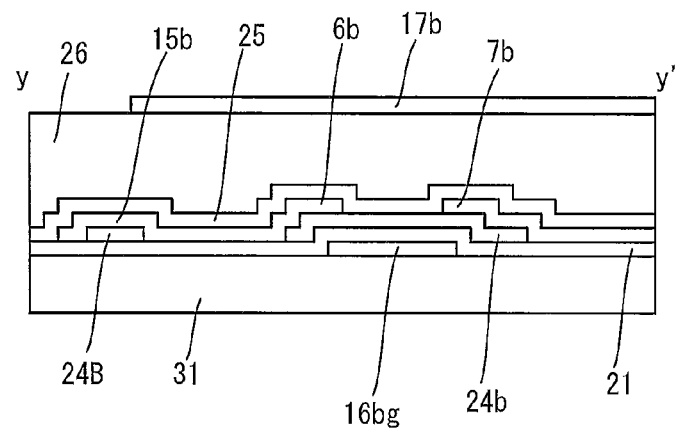
FIG. 17 is a cross-sectional view taken from the line y-y' of FIG. 15.
Figure 18:
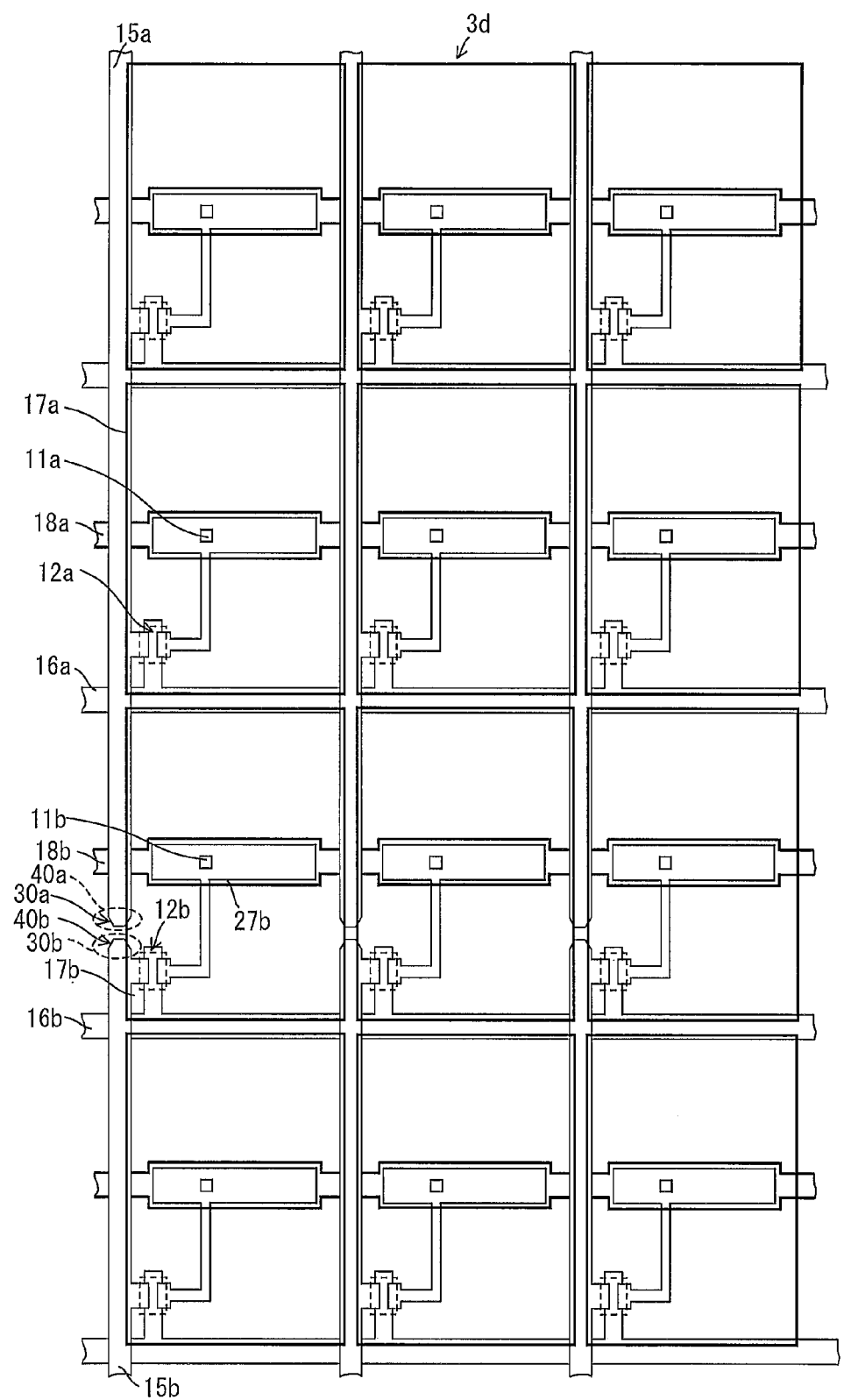
FIG. 18 is a plan view which shows a modified example of FIG. 14.
Figure 19:
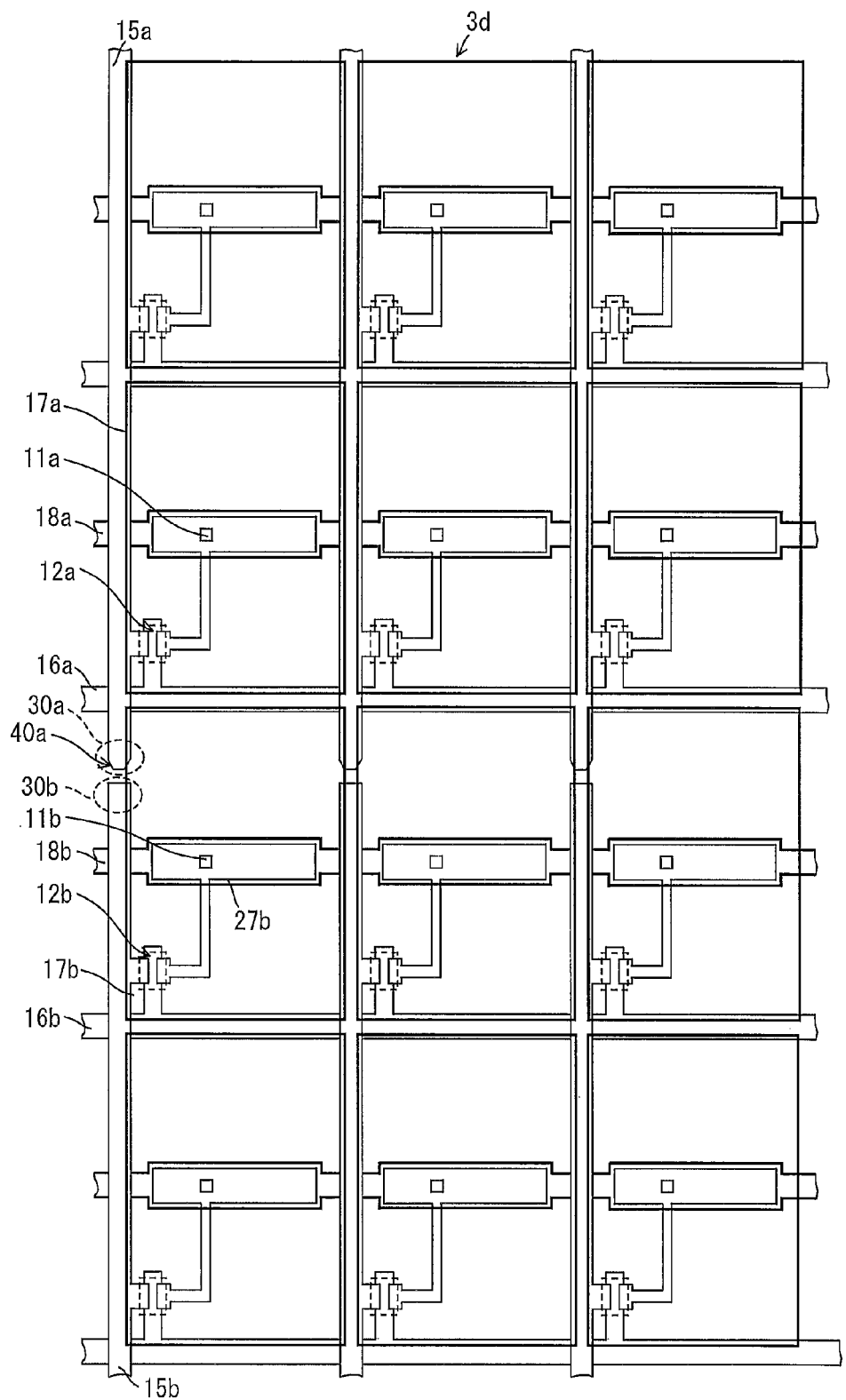
FIG. 19 is a plan view which shows another modified example of FIG. 14.
Figure 20:
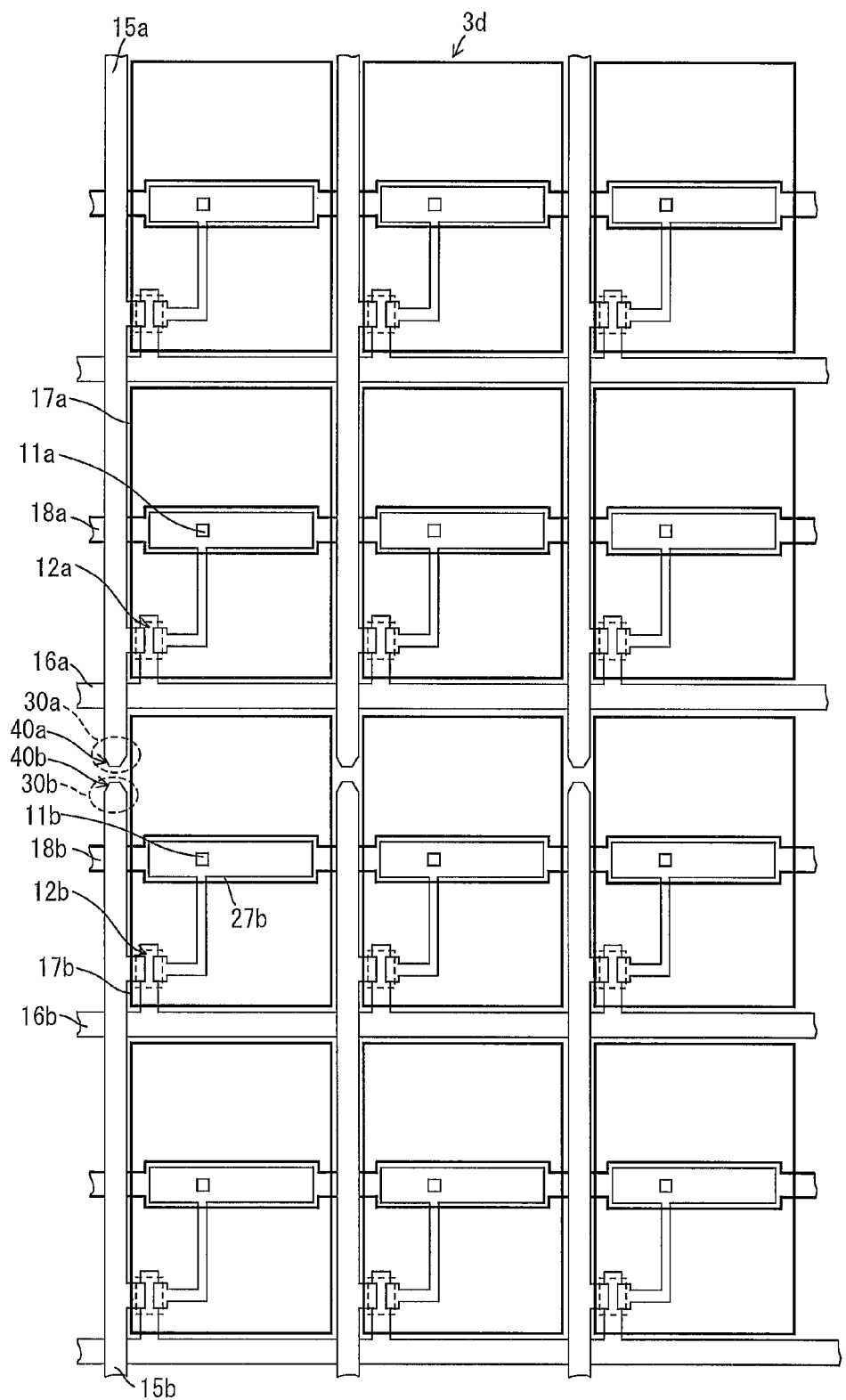
FIG. 20 is a plan view which shows still another modified example of FIG. 14.

FIG. 13 is a schematic view which shows a configuration of a liquid crystal display device of a third embodiment. FIG. 14 is a plan view which shows a configuration of a part enclosed by a broken line in FIG. 13 (a part of an active matrix substrate). FIG. 15 is an enlarged view of a part of FIG. 14. FIG. 16 is a cross-sectional view taken from the line x-x' of FIG. 15. FIG. 17 is a cross-sectional view taken from the line y-y' of FIG. 15.

A liquid crystal display device 1d includes an active matrix substrate 3d, a gate driver GD, a first source driver SD, a second source driver sd, and a display control circuit DCC (see FIG. 13).

The active matrix substrate 3d has (i) a first region 10a located upstream of a scanning direction and (ii) a second region 10b located downstream of the scanning direction (see FIG. 13). In the first region 10a, a plurality of data lines (including a data line 15a) which extend in the column direction (scanning direction, longitudinal direction in FIG. 13) are aligned in the row direction (transverse direction in FIG. 13), and a plurality of scanning lines (including a scanning line 16a) which extend in the row direction are aligned in the column direction (longitudinal direction in FIG. 13). In the second region 10b, a plurality of data lines (including a data line 15b) which extend in the column direction (scanning direction, longitudinal direction in FIG. 13) are aligned in the row direction (transverse direction in FIG. 13), and a plurality of scanning lines (including a scanning line 16b) which extend in the row direction are aligned in the column direction (longitudinal direction in FIG. 13).

The data line 15a and the data line 15b which are provided so as to correspond to an identical pixel column are aligned in the column direction (vertically aligned in FIG. 14) (see FIG. 14). The data line 15a is connected via a transistor 12a to a pixel electrode 17a (first electrode), which is a display pixel electrode. The data line 15b is connected via a transistor 12b to a pixel electrode 17b (second electrode), which is a display pixel electrode.

More specifically, the transistor 12a has a gate electrode 16ag which is connected to the scanning line 16a (scanning line located at the bottom of the first region 10a), a source electrode 6a which is connected to the data line 15a, and a drain electrode 7a which is connected to a drain drawing electrode 27a that overlaps a retention capacitor wire 18a and is connected via a contact hole 11a to the pixel electrode 17a (see FIG. 14 and FIG. 15). The transistor 12b has a gate electrode 16bg which is connected to the scanning line 16b (scanning line located at the top of the second region 10b), a source electrode 6b which is connected to the data line 15b, and a drain electrode 7b which is connected to a drain drawing electrode 27b that overlaps a retention capacitor wire 18b and is connected via a contact hole 11b to the pixel electrode 17b.

The active matrix substrate 3d is configured as below (see FIG. 16 and FIG. 17). A gate metal which includes the retention capacitor wire 18b and the gate electrode 16bg of the transistor 12b is provided on a glass substrate 31. A gate insulating film 21 is provided so as to cover the gate metal. Semiconductor layers 24b, 24A, 24B, and a source metal which includes the data lines 15a and 15b, the drain drawing electrode 27b, and the source electrode and the drain electrode of the transistor 12b are stacked on the gate insulating film 21. An inorganic interlayer insulating film 25 and an organic interlayer insulating film 26 which is thicker than the inorganic interlayer insulating film 25 are stacked on the source metal. A transparent electrode layer (e.g., an ITO) which includes the pixel electrode 17b is provided on the organic interlayer insulating film 26. An alignment film (not illustrated) is provided on the transparent electrode layer. Note that the inorganic interlayer insulating film 25 and the organic interlayer insulating film 26 are removed in the contact hole 11b, so that the pixel electrode 17b and the drain drawing electrode 27b are in contact with each other.

Refer to FIG. 13 again. The gate driver GD drives, in accordance with an instruction from the display control circuit DCC, the scanning lines (including the scanning line 16a) which are provided in the first region 10a and the scanning lines (including the scanning line 16b) which are provided in the second region 10b. The first source driver SD drives, in accordance with the instruction from the display control circuit DCC, the data lines (including the data line 15a) which are provided in the first region 10a. The second source driver sd drives, in accordance with the instruction from the display control circuit DCC, the data lines (including the data line 15b) which are provided in the second region 10b. More specifically, when the scanning line 16a is selected, a data signal is written from the first source driver SD via the transistor 12a and the data line 15a to the pixel electrode 17a. When the scanning line 16b is selected, a data signal is written from the second source driver sd via the transistor 12b and the data line 15b to the pixel electrode 17b. The first region 10a and the second region 10b, which are independently driven, allow the active matrix substrate to be driven at double speed.

According to the third embodiment, an end 30a which is one of both ends of the data line 15a and faces the the data line 15b has a shape which is symmetrical about the row direction, and includes a tapered part 40a which is formed in a case where a polygonal line that is a part of a rim of the end 30a and protrudes toward the data line 15b is made up of three sides other than a lower base of an isosceles trapezoid (a part which is tapered toward the data line 15b). An end 30b which is one of both ends of the data line 15b and faces the data line 15a has a shape which is symmetrical about the row direction, and includes a tapered part 40b which is formed in a case where a polygonal line that is a part of a rim of the end 30b and protrudes toward the data line 15a is made up of three sides other than a lower base of an isosceles trapezoid (a part which is tapered toward the data line 15a). Namely, the end 30b and the end 30a are in line symmetry with respect to a line which extends through a center of a gap between the end 30a and the end 30b in the row direction.

According to the third embodiment, the end 30a of the data line 15a is shaped to include the tapered part 40a and the end 30b of the data line 15b is shaped to include the tapered part 40b. Therefore, during a photolithography process for forming the data lines, light is easily diffracted into a gap region between the data line 15a and the data line 15b, so that resist residue is less likely to occur in the gap region. This makes it possible to prevent an occurrence of a short circuit caused by a resist residue between the data line 15a and the data line 15b (If there is a resist residue, no metal in the gap region is removed, so that these data lines are short-circuited). Such an advantage is clear in a case where a first part of an edge of the pixel electrode 17b extends along a gap between the data line 15a and the data line 15b and it is impossible to increase the gap (since the increase in gap causes the pixel electrode 17b and the other pixel electrodes to greatly differ in parasitic capacitance) (see FIG. 14 and FIG. 15).

Further, according to the third embodiment, since a rim of each of the tapered part 40a and the tapered part 40b is made up of three sides other than a lower base of an isosceles trapezoid, light is obliquely diffracted into the gap region between the data line 15a and the data line 15b from four directions. This effectively prevents an occurrence of resist residue.

In addition, according to the third embodiment, an influence of a parasitic capacitor defined between the pixel electrode 17b and the data line 15a is reduced by causing a second part of the edge of the electrode 17b which second part extends along the data line 15a to have a smaller length than a third part of the electrode 17b which third part extends along the data line 15b.

[Fourth Embodiment]

An end 30a and an end 30b which are illustrated in FIG. 14 can be configured as shown in FIG. 7 and FIG. 8.

In FIG. 14, a gap between a data line 15a and a data line 15b is provided so as to be closer to a scanning line 16a. However, how to provide the gap is not limited to this. A gap between the readout line 14a and the readout line 14b can also be provided so as to be closer to the scanning line 16b (provided near a transistor 12b) (see FIG. 18). Note that in order to cover the transistor 12b (block light) with a black matrix which is provided on a counter substrate (color filter substrate), it is also possible to provide the gap between the data line 15a and the data line 15b so that the gap overlaps the black matrix which covers the transistor 12b (to block light by covering the gap with the black matrix).

Figure 11:
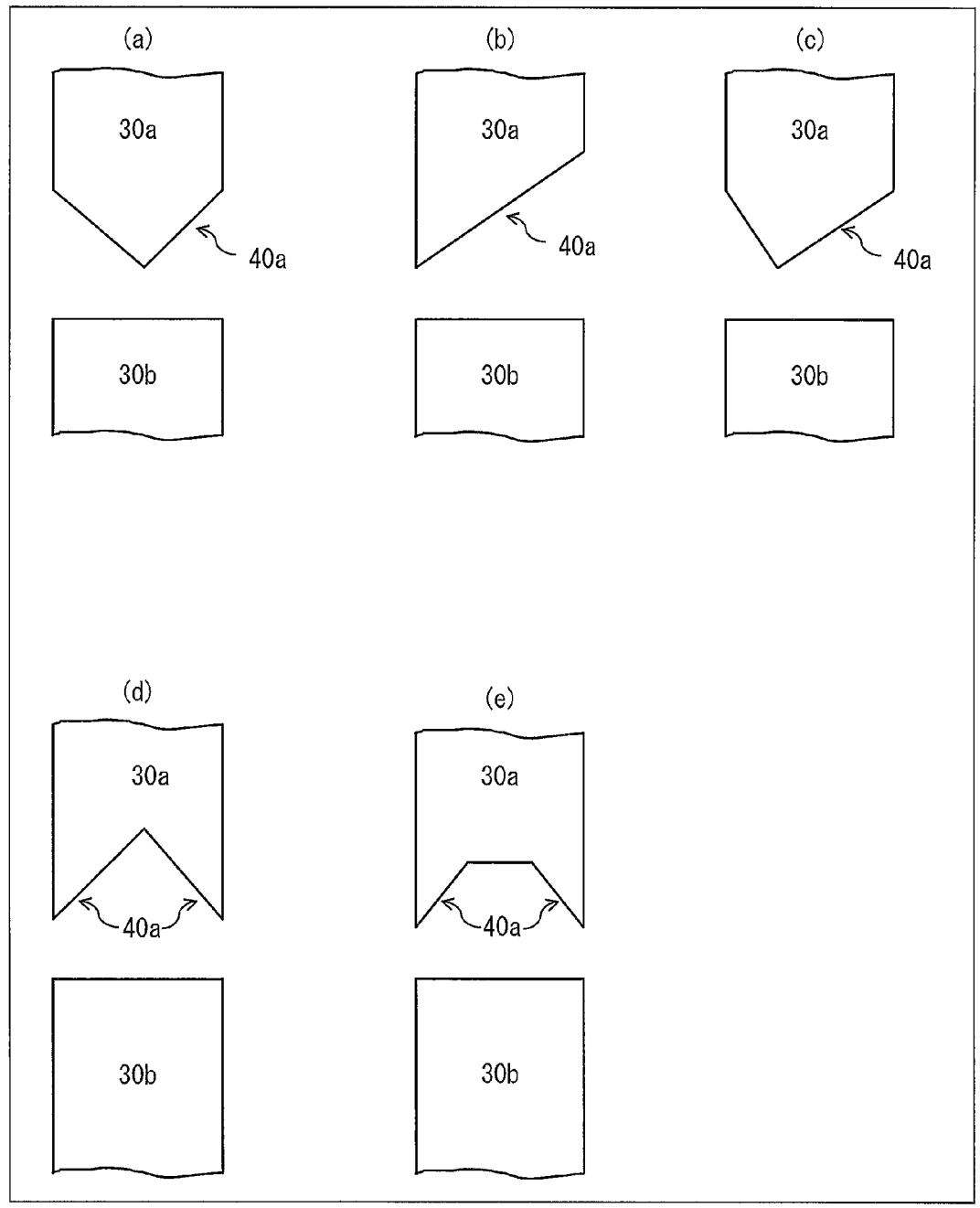
FIG. 11 is a plan view which shows an example of how a first end and a second end are configured (in which example only a rim of either the first end or the second end is a polygonal line).
Figure 12:
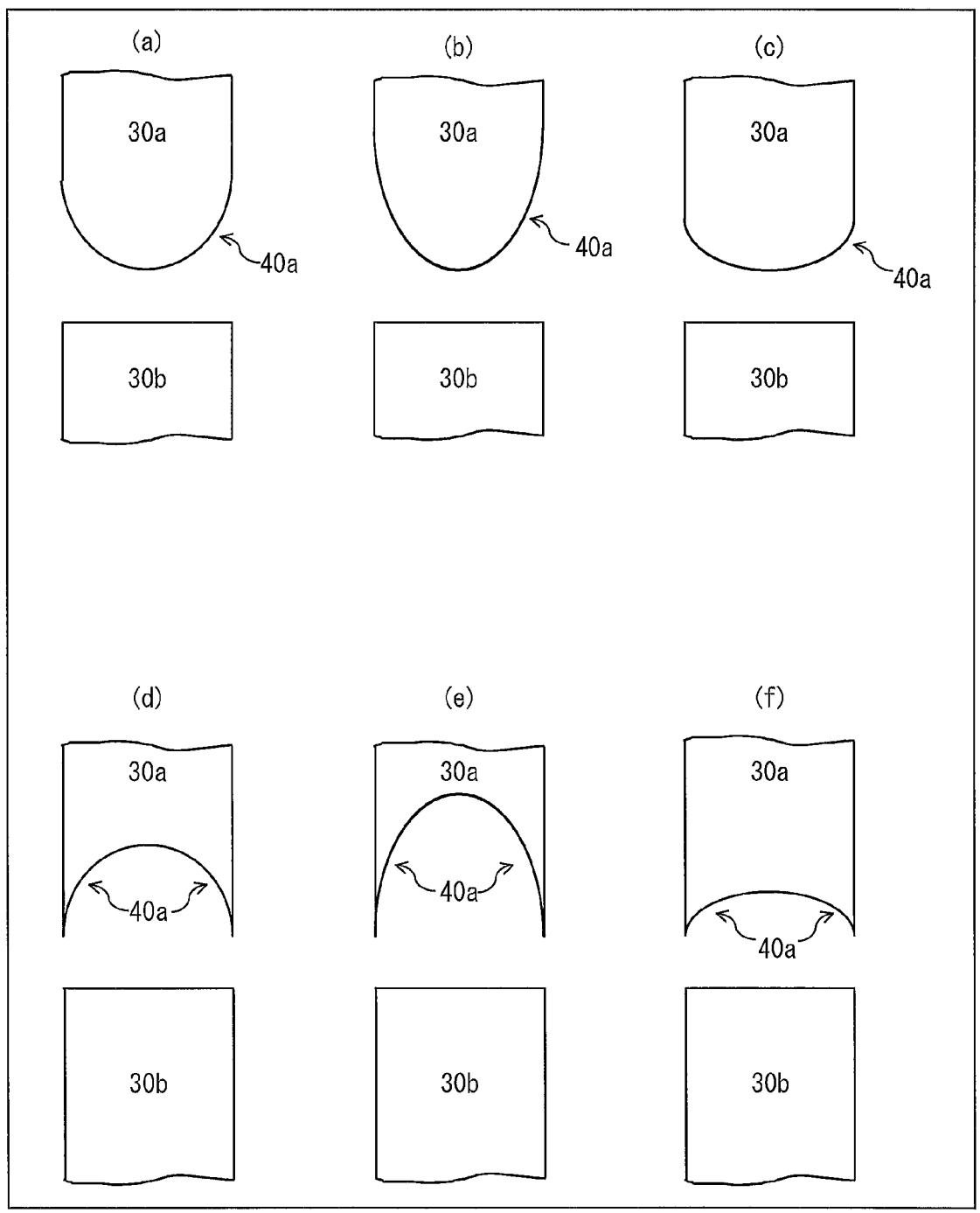
FIG. 12 is a plan view which shows an example of how the first end and the second end are configured (in which example only the rim of either the first end or the second end is a curved line).

In FIG. 14, the end 30a and the end 30b include the respective tapered parts. However, how to configure the end 30a and the end 30b is not limited to this. Only the end 30a can include a tapered part 40a (a part which is tapered toward the data line 15b) (see FIG. 19). Note that the tapered part 40a is formed in a case where a polygonal line that is a part of a rim of the end 30a and protrudes toward the data line 15b is made up of three sides other than a lower base of an isosceles trapezoid. Similarly, the end 30a and the end 30b can be configured as shown in FIG. 11 and FIG. 12.

In FIG. 14 through FIG. 17, in order to increase an aperture ratio, an edge of a pixel electrode 17b overlaps the data line 15a, the data line 15b, and the scanning line 16b. However, how to configure the edge of the pixel electrode 17b is not limited to this. The edge of the pixel electrode 17b can also extend along the data line 15a, the data line 15b, and the scanning line 16b (see FIG. 20).

As described earlier, an active matrix substrate of the present invention includes: a first signal line and a second signal line which are aligned in a column direction in which the first signal line and the second signal line extend; a first transistor and a second transistor; and a first electrode and a second electrode, the first signal line being connected via the first transistor to the first electrode, and the second signal line being connected via the second transistor to the second electrode, and the first signal line having a first end which is one of both ends of the first signal line and faces the second signal line, the first end including a tapered part which is tapered toward the second signal line.

The configuration makes it possible to prevent an occurrence of a short circuit between the first signal line and the second signal line.

The active matrix substrate of the present invention can be configured such that a part of an edge of the second electrode extends along or overlap a gap between the first signal line and the second signal line.

The active matrix substrate of the present invention can be configured such that a part of an edge of the second electrode extends along or overlap the first signal line.

The active matrix substrate of the present invention can be configured such that a minimum distance between the first signal line and the second signal line is equal to or greater than a distance between a source electrode and a drain electrode of the first transistor.

The active matrix substrate of the present invention can be configured such that the first end has a shape which is symmetrical about a row direction.

The active matrix substrate of the present invention can be configured such that the tapered part is formed by causing a part of a rim of the first end to have a shape of a polygonal line which protrudes toward the second signal line.

The active matrix substrate of the present invention can be configured such that the tapered part is formed by causing a part of a rim of the first end to have a shape of a polygonal line which protrudes away from the second signal line.

The active matrix substrate of the present invention can be configured such that the shape of the polygonal line is made up of three sides other than a lower base of an isosceles trapezoid.

The active matrix substrate of the present invention can be configured such that the shape of the polygonal line is made up of two sides of a triangle.

The active matrix substrate of the present invention can be configured such that the tapered part is formed by causing a part of a rim of the first end to have a shape of a curved line which protrudes toward the second signal line.

The active matrix substrate of the present invention can be configured such that the tapered part is formed by causing a part of a rim of the first end to have a shape of a curved line which protrudes away from the second signal line.

The active matrix substrate of the present invention can be configured such that the curved line is arc-shaped.

The active matrix substrate of the present invention can be configured such that the curved line is quadratic-curve-shaped.

The active matrix substrate of the present invention can be configured such that a second end which is one of both ends of the second signal line and faces the first signal line includes a tapered part which is tapered toward the first signal line.

The active matrix substrate of the present invention can be configured such that the second end and the first end are in line symmetry with respect to a line which extends through a gap between the first end and the second end in a row direction.

The active matrix substrate of the present invention can be configured such that the first electrode and the second electrode are sensing electrodes.

The active matrix substrate of the present invention can be configured such that the first electrode and the second electrode are display electrodes.

An x-ray sensor device includes an active matrix substrate mentioned above.

A display device includes an active matrix substrate mentioned above.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A display device of the present invention is suitable for, for example, a radiation detector (e.g., an x-ray sensor device)

and a large-sized high-definition display device (e.g., a television receiver, a digital signage, or a medical monitor).

REFERENCE SIGNS LIST

1s X-ray sensor device
1d Liquid crystal display device
3s, 3d Active matrix substrate
16a Scanning line (first scanning line)
16b Scanning line (second scanning line)
17a Pixel electrode (first electrode)
17b Pixel electrode (second electrode)
12a Transistor (first transistor)
12b Transistor (second transistor)
14a Readout line (first signal line)
14b Readout line (second signal line)
15a Data line (first signal line)
15b Data line (second signal line)
30a End (of readout line 14a or data line 15a)
30b End (of readout line 14b or data line 15b)
40a Tapered part (of end 30a)
40b Tapered part (of end 30b)

The invention claimed is:

1. An active matrix substrate comprising:
a first signal line and a second signal line which are aligned in a column direction in which the first signal line and the second signal line extend;
a first transistor and a second transistor; and
a first electrode and a second electrode, wherein
the first signal line being connected via the first transistor to the first electrode, and the second signal line being connected via the second transistor to the second electrode;
the first signal line having a first end which is one of both ends of the first signal line and faces the second signal line, the first end including a tapered part which is tapered toward the second signal line; and
a minimum distance between the first signal line and the second signal line is equal to or greater than a distance between a source electrode and a drain electrode of the first transistor.

2. The active matrix substrate according to claim 1, wherein the first electrode and the second electrode are sensing electrodes.

3. An x-ray sensor device comprising an active matrix substrate recited in claim 2.

4. The active matrix substrate according to claim 1, wherein the first electrode and the second electrode are display electrodes.

5. A display device comprising an active matrix substrate recited in claim 4.

6. An active matrix substrate comprising:
a first signal line and a second signal line which are aligned in a column direction in which the first signal line and the second signal line extend;
a first transistor and a second transistor; and
a first electrode and a second electrode, wherein
the first signal line being connected via the first transistor to the first electrode, and the second signal line being connected via the second transistor to the second electrode;
the first signal line having a first end which is one of both ends of the first signal line and faces the second signal line, the first end including a tapered part which is tapered toward the second signal line; and
the tapered part is formed by causing a part of a rim of the first end to have a shape of a polygonal line: (i) which protrudes toward the second signal line, or (ii) which protrudes away from the second signal line.

7. The active matrix substrate according to claim 6, wherein the shape of the polygonal line is made up of three sides other than a lower base of an isosceles trapezoid.

8. The active matrix substrate according to claim 6, wherein the shape of the polygonal line is made up of two sides of a triangle.

9. The active matrix substrate according to claim 6, wherein the first electrode and the second electrode are sensing electrodes.

10. The active matrix substrate according to claim 6, wherein the first electrode and the second electrode are display electrodes.

11. The An active matrix substrate , comprising:
a first signal line and a second signal line which are aligned in a column direction in which the first signal line and the second signal line extend;
a first transistor and a second transistor; and
a first electrode and a second electrode, wherein
the first signal line being connected via the first transistor to the first electrode, and the second signal line being connected via the second transistor to the second electrode;
the first signal line having a first end which is one of both ends of the first signal line and faces the second signal line, the first end including a tapered part which is tapered toward the second signal line; and
the tapered part is formed by causing a part of a rim of the first end to have a shape of a curved line: (i) which protrudes toward the second signal line, or (ii) which protrudes away from the second signal line.

12. The active matrix substrate according to claim 11, wherein the curved line is arc-shaped.

13. The active matrix substrate according to claim 11, wherein the curved line is quadratic-curve-shaped.

14. The active matrix substrate according to claim 11, wherein the first electrode and the second electrode are sensing electrodes.

15. The active matrix substrate according to claim 11, wherein the first electrode and the second electrode are display electrodes.

16. An active matrix substrate, comprising:
a first signal line and a second signal line which are aligned in a column direction in which the first signal line and the second signal line extend;
a first transistor and a second transistor; and
a first electrode and a second electrode, wherein
the first signal line being connected via the first transistor to the first electrode, and the second signal line being connected via the second transistor to the second electrode;
the first signal line having a first end which is one of both ends of the first signal line and faces the second signal line, the first end including a tapered part which is tapered toward the second signal line; and
a second end which is one of both ends of the second signal line and faces the first signal line includes a tapered part which is tapered toward the first signal line.

17. The active matrix substrate according to claim 16, wherein the second end and the first end are in line symmetry with respect to a line which extends through a gap between the first end and the second end in a row direction.

18. The active matrix substrate according to claim 16, wherein the first electrode and the second electrode are sensing electrodes.

19. The active matrix substrate according to claim 16, wherein the first electrode and the second electrode are display electrodes.

* * * * *